(12) United States Patent
Novet

(10) Patent No.: US 10,488,993 B2
(45) Date of Patent: Nov. 26, 2019

(54) EMBEDDED CAPACITIVE SENSOR IN METAL CASE

(71) Applicant: ANALOG DEVICES, INC, Norwood, MA (US)

(72) Inventor: Isaac Chase Novet, Carlsbad, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/004,551

(22) Filed: Jan. 22, 2016

(65) Prior Publication Data

US 2017/0212614 A1 Jul. 27, 2017

(51) Int. Cl.
*G06F 1/16* (2006.01)
*G06F 3/044* (2006.01)
*G06F 3/0488* (2013.01)

(52) U.S. Cl.
CPC ............ *G06F 3/044* (2013.01); *G06F 1/1692* (2013.01); *G06F 3/04883* (2013.01); *G06F 2203/04103* (2013.01)

(58) Field of Classification Search
CPC ......... G06F 1/1692; G06F 1/169; G06F 3/044
See application file for complete search history.

(56) References Cited

U.S. PATENT DOCUMENTS

| 9,423,418 B2 * | 8/2016 | Alameh | G01D 5/24 |
| 2014/0041904 A1 * | 2/2014 | Pedder | G06F 3/044 |
| | | | 174/251 |
| 2014/0049505 A1 * | 2/2014 | Radivojevic | G06F 3/04883 |
| | | | 345/174 |
| 2014/0375903 A1 * | 12/2014 | Westhues | G06F 3/044 |
| | | | 349/12 |
| 2015/0177298 A1 * | 6/2015 | Sugiura | G06F 3/044 |
| | | | 324/658 |

OTHER PUBLICATIONS

*Application Note, AN2869, Guidelines for Designing Touch Sensing Applications*, Feb. 2009, Rev. 1, 16 pages, www.st.com.
*Application Note, AN2869, Guidelines for Designing Touch Sensing Applications*, May 2012, Doc ID 15298 Rev. 6, 43 pages, www.st.com.

(Continued)

*Primary Examiner* — Amr A Awad
*Assistant Examiner* — Stephen A Bray
(74) *Attorney, Agent, or Firm* — Patent Capital Group

(57) ABSTRACT

Metal cases are increasingly in popularity in electronics such as smart phones, tablets, portable speakers, etc., since the look and feel of a metal case are appealing to the consumer. Unfortunately, the metal case is generally incompatible traditional capacitive sensing electrodes, which are usually provided on a printed circuit board or flex circuit and are only usable with plastic cases. To provide capacitive sensing with a metal case, a specialized material stack can be fabricated to embed capacitive sensors with the metal case. Specifically, a conductor (a conductive pad, or conductive layer) can be deposited over an oxide layer formed on the metal case (e.g., through anodization). An outer coating can be provided to protect the conductor. A further conductor and dielectric can be included in the material stack to form a double layer capacitive sensor.

18 Claims, 9 Drawing Sheets

Cross Section

(56) References Cited

OTHER PUBLICATIONS

*Application Note, AN3431, How to Design a PresSense Pressure Touch Button*, Sep. 2011, Doc ID 019017 Rev. 1, 18 pages, www.st.com.
*QTAN0079 Buttons, Sliders and Wheels, Sensor Design Guide*, Atmel, 10752A-AT42-08/11, 72 pages, www.atmel.com.
*Touch Through Metal, mTouch™ Metal Over Capacitive Technology*, Part 1, © 2010 Microchip Technology Incorporated, 26 pages.
*Capacitive Touch Sensors, Application Fields, Technology Overview and Implementation Example*, Fujitsu Microelectronics Europe GmbH, 12 pages.
*Application Note, AZD008, IQ Switch®—ProxSense® Series Design Guidelines*, © 2011 Azoleq (Pty) Ltd, AZD008—Design Guidelines—Revision 1.05, Sep. 2011, 14 pages.

\* cited by examiner

*Cross Section*

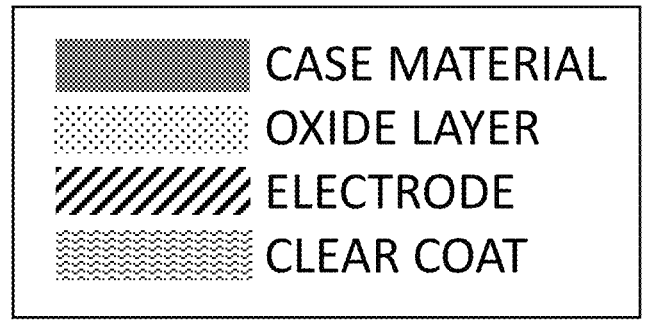
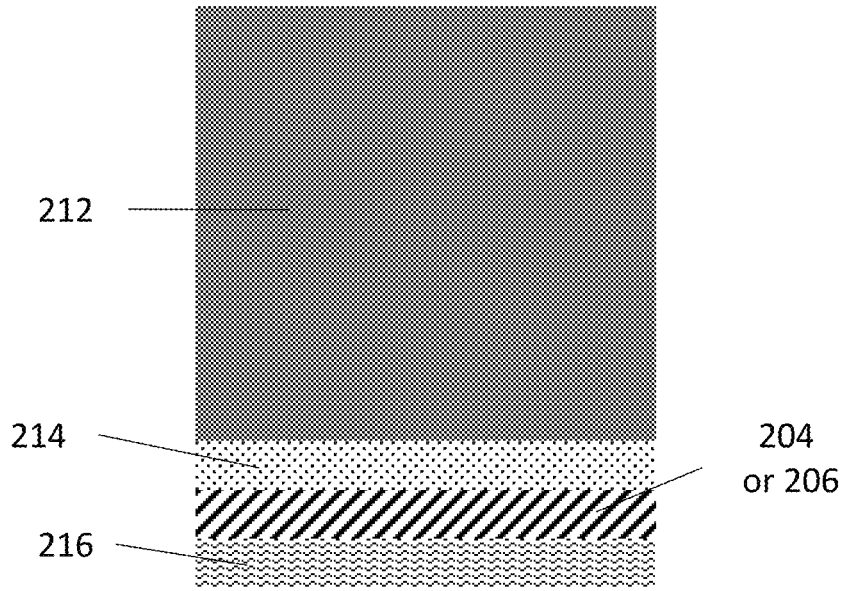
FIGURE 3   *Zoomed In Cross Section 220 of FIGURE 2*

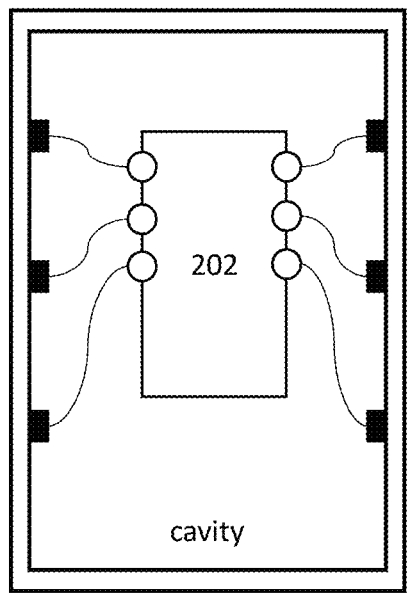
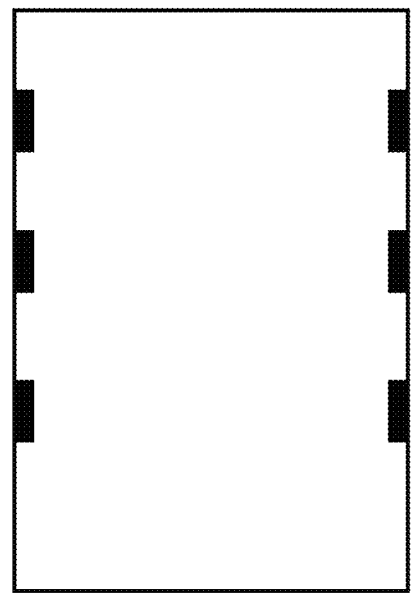
FIGURE 4A
*Facing cavity / inside*
FIGURE 4B
*Facing user / outside*
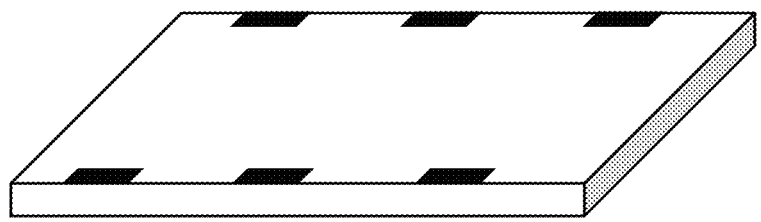
FIGURE 4C
*Facing user / outside / perspective*

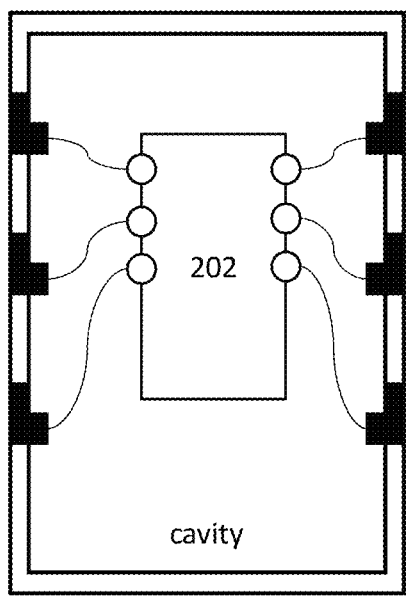
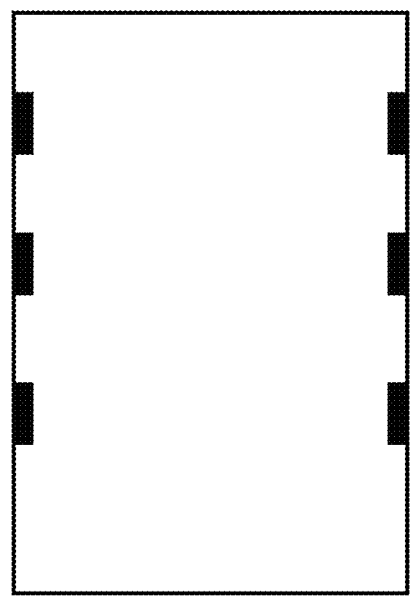
FIGURE 5A
*Facing cavity / inside*
FIGURE 5B
*Facing user / outside*
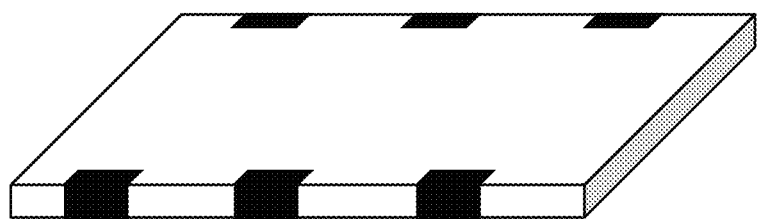
FIGURE 5C
*Facing user / outside / perspective*

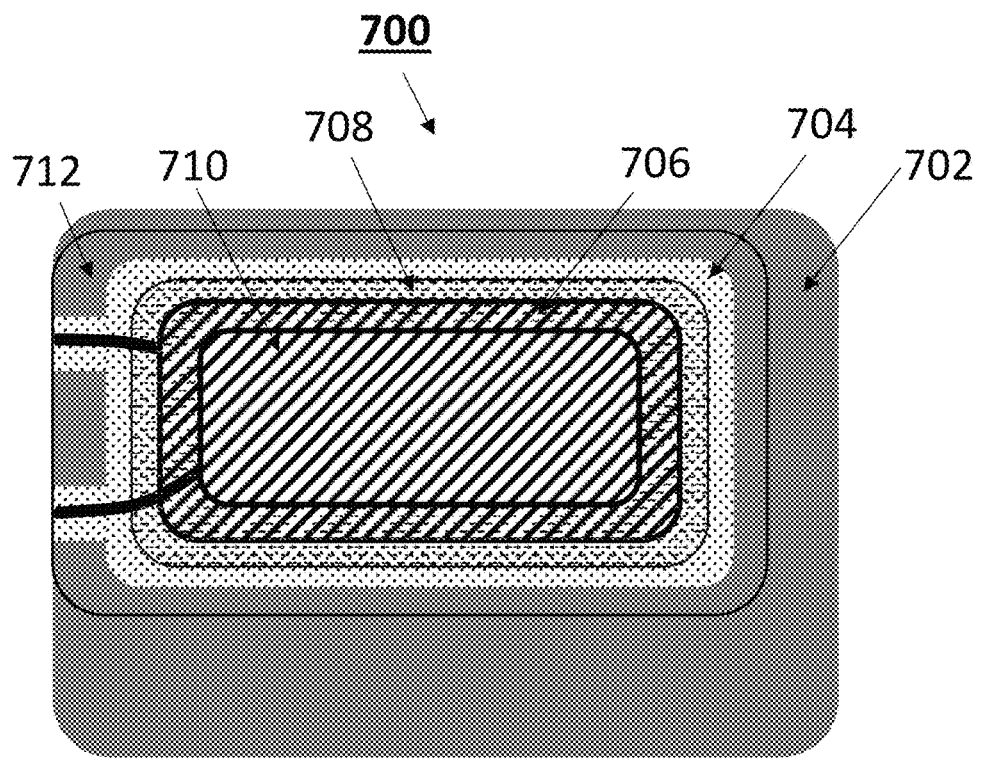
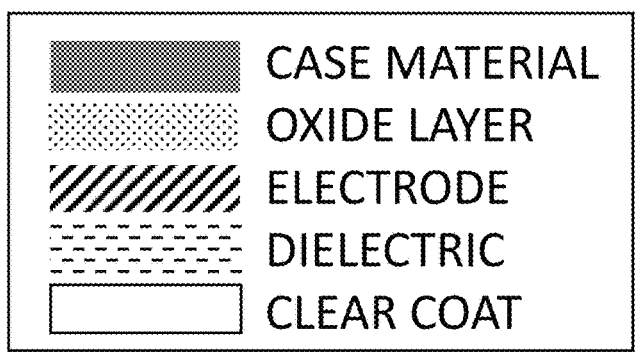
FIGURE 7
*Facing user / outside*
*Not to scale*

EMBEDDED CAPACITIVE SENSOR IN METAL CASE

TECHNICAL FIELD OF THE DISCLOSURE

The present invention relates to the field of integrated circuits, in particular to embedded capacitive sensors in metal case of electronic devices.

BACKGROUND

Mobile devices are ubiquitous. The ways to interact with them and the ways mobile devices behave have evolved over time. One important technology for mobile devices is their sensing capabilities. Sensing can occur via many modalities, such as haptic/pressure sensing, audio sensing, light/vision sensing, temperature sensing, and capacitive sensing. Not only can these modalities allow us to interact with the mobile device in a myriad of different ways, these modalities allow the mobile device to become "smarter" such that the mobile devices can better understand contexts and the way users are interacting with the mobile devices.

One interesting modality is capacitive sensing. Capacitive sensing has been used with touch screens for some time to allow user to provide user input via the screen of a mobile device without the use of physical buttons. In some applications, capacitive sensing on a large surface/skin can even be used for sensing grip or hand postures. In some other applications, two electrodes can be provided, one on each side of a mobile device for whole hand recognition. In yet some other applications, an electrode can be provided adjacent to an antenna to detect the presence of a finger or hand in close proximity to the antenna.

OVERVIEW

Metal cases are increasing in popularity in electronics such as smart phones, tablets, portable speakers, etc., since the look and feel of a metal case are appealing to the consumer. Unfortunately, the metal case is generally incompatible traditional capacitive sensing electrodes, which are usually provided on a printed circuit board or flex circuit and are only usable with plastic cases. To provide capacitive sensing with a metal case, a specialized material stack can be fabricated to embed capacitive sensors with the metal case. Specifically, a conductor (a conductive pad, or conductive layer) can be deposited over an oxide layer formed on the metal case (e.g., through anodization). An outer coating can be provided to protect the conductor. A further conductor and dielectric can be included in the material stack to form a double layer capacitive sensor.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 3 shows an exemplary zoomed-in view of a part of the cross section illustrated in FIG. 2, according to some embodiments of the disclosure;

FIGS. 4A-C show different views of an exemplary metal case having six embedded capacitive sensors of a first design and associated electronics, according to some embodiments of the disclosure;

FIGS. 5A-C show different views of an exemplary metal case having six embedded capacitive sensors of a second design and associated electronics, according to some embodiments of the disclosure;

FIG. 7 shows a view of an exemplary metal case having an embedded double layer capacitive sensor and associated electronics, according to some embodiments of the disclosure;

DESCRIPTION OF EXAMPLE EMBODIMENTS OF THE DISCLOSURE

Capacitive Sensing and its Applications in Mobile Devices

Capacitive sensing is used in many different types of sensors, including those to detect and measure proximity, position or displacement, humidity, fluid level, and acceleration. Capacitive sensing as a human interface device (HID) technology (for example, providing touch screens to replace the computer mouse) has become more popular. The HID technology can be based on capacitive coupling, which takes human body capacitance as input. Capacitive touch sensors are used in many devices such as laptop trackpads, digital audio players, computer displays/touch screens, mobile phones, mobile devices, tablets, etc. Design engineers continue to choose capacitive sensors for their versatility, reliability and robustness, unique human-device interface, and cost reduction over mechanical switches.

Figure 1:
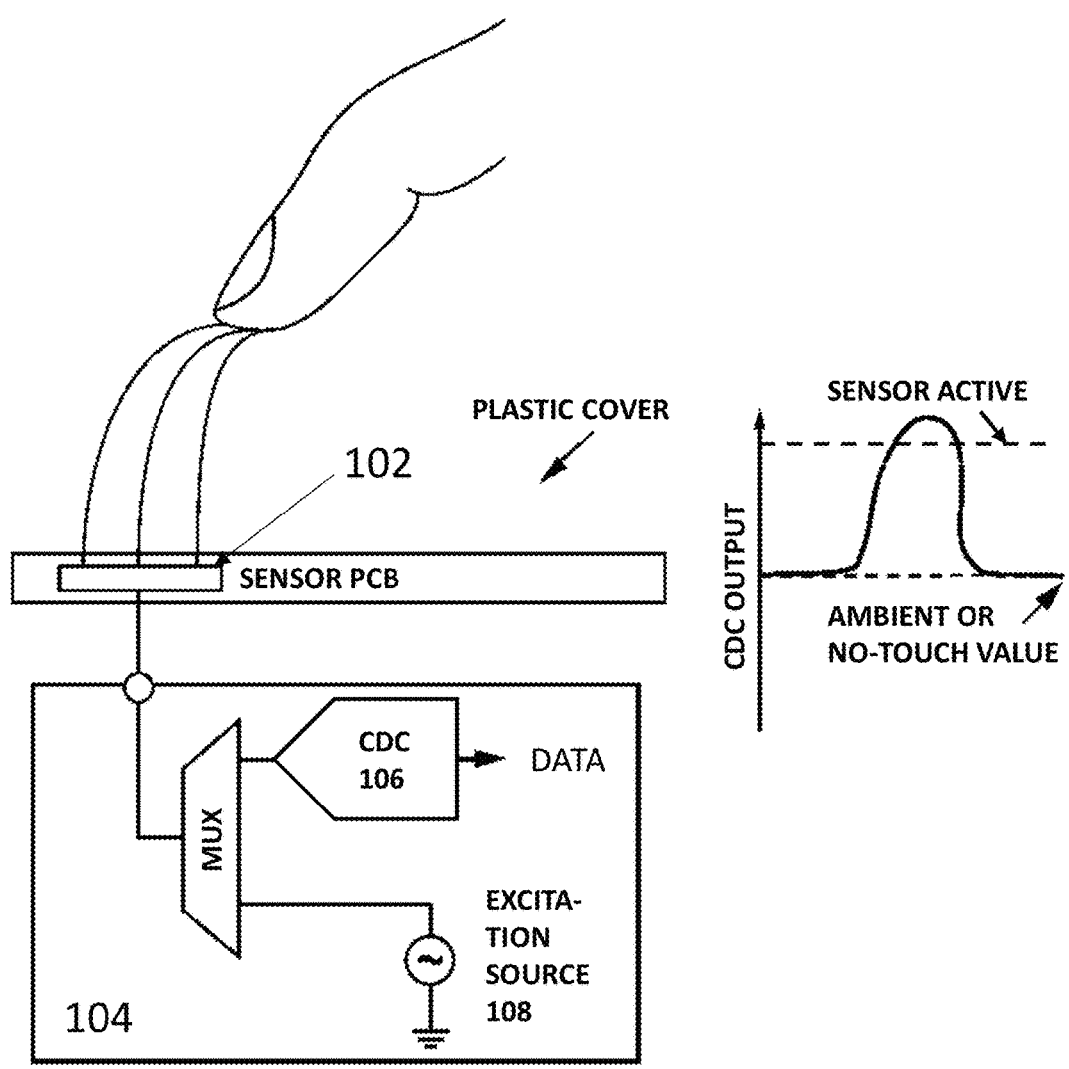
FIG. 1 illustrates a capacitive sensing system having a single capacitive sensing electrode and an exemplary capacitive sensing response generated by the system when a finger approaches the electrode, according to some embodiments of the disclosure.

Capacitive sensors generally detect anything that is conductive or has a dielectric different than that of air, for example, part of a human hand or finger. FIG. 1 illustrates a capacitive sensing system having a single capacitive sensing electrode and an exemplary capacitive sensing response generated by the system when a finger approaches the electrode, according to some embodiments of the disclosure. When an excitation signal charges a capacitive sensor 102 (e.g., an electrode or conductor provided on a printed circuit board or flex circuit), the capacitive sensor 102 becomes one of the two plates of a virtual capacitor. When an object comes close to the capacitive sensor acting as the second plate of the virtual capacitor, the virtual capacitance based on the charge present on the capacitive sensor can be measured, e.g., by a capacitive sensing controller 104. A capacitive sensing controller 404 is an electronic device which can include an analog front end which is configured to measure the virtual capacitance and convert the analog measurement to digital data using the capacitance to digital converter (CDC) 106. Some capacitive sensing controllers can generate high resolution capacitive measurement data, as high as 16-bits or more for each capacitive sensor. The capacitive sensing controller 104 can also provide an excitation source 108 for providing the excitation signal to the capacitive sensor 102. Typically, the capacitive sensing controller 104 can have a plurality of input pins connectable to a number of capacitive sensors. When the object, e.g., the finger, moves towards the capacitive sensor 102, the capacitive sensor 102 generates a rising response as seen in the response plot showing the output of CDC 106. When the object moves away from the capacitive sensor 102 generates a falling response. In many conventional capacitive sensing applications, the CDC output crossing a "sensor active" threshold would trigger an "on" state, enabling the capacitive sensor 102 to provide an "on or off" function.

Capacitive sensing for mobile devices is particularly useful for sensing a dynamic environment surrounding the mobile device. Electrodes as capacitive sensors can be inexpensive and these electrodes can be extremely compact and thin, which makes capacitive sensing particularly suitable for mobile devices whose form factor can impose constraints on the electronics inside them. For instance, capacitive sensing can obviate the need for mechanical buttons which can often be difficult to provide in a mobile device, whose design constraints continuously drives the devices to be smaller, smoother and/or waterproof. Capacitive sensing can provide gesture sensing, environment sensing, material sensing, pressure sensing, sound sensing, user interaction sensing, etc.

Mobile devices (or sometimes referred herein as handheld devices) within the context of this disclosure includes electronic devices which can be held by one or more hands of a user or users (the electronic devices can be completely mobile, and the electronic devices can be tethered to other electronics). Mobile devices can include mobile phones, tablets, laptops, portable speakers, wearable electronics (e.g., watches, earbuds, goggles, glasses), etc. Mobile devices, by virtue of having a small form factor, are usually held by a user's hand or hands during use. With mobile devices, user interface modalities can be restricted in their capabilities, since physical user interfaces are usually are confined to the small form factor of the mobile device. Furthermore, any user interface modality, e.g., voice command recognition, can be limited by the processing power and power budget on these mobile devices.

While the present disclosure includes examples related to these types of mobile devices having form factors which can be held easily by hands of a user, the sensor arrangements described herein are also applicable to electronic devices in general (even if the mobility is limited). For instance, exemplary electronic devices can include steering wheels, gaming console controllers, household appliances, interactive displays, etc. Broadly speaking, it is understood by one skilled in the art that the sensor arrangements disclosed herein can be applied to electronic devices which users (or even animals) are expected to interact with using their hands and/or fingers ("handheld devices").

Metal Case Design Poses a Challenge for Capacitive Sensing

The configuration of the capacitive sensor 102 seen in FIG. 1 provided on a printed circuit board or flex circuit are generally provided behind a plastic cover (or plastic overlay) that is exposed to the outside environment of the capacitive sensor. The capacitive sensor 102 is able to sense the environment through the plastic cover (since the electric field is not substantially impacted by the plastic cover). Plastic covers have been widely used for mobile devices, e.g., such as the removable cover which covers a back of a mobile phone where the battery and electronics reside, but metal cases are quickly gaining popularity. The look and feel of the mobile device with a metal case are sometimes preferred by users over mobile devices with a plastic case. Unfortunately, it is incompatible to provide the capacitive sensor (e.g., capacitive sensor 102 of FIG. 1) behind or inside a metal case since the metal case acts as a Faraday shield and restricts electrostatic fields generated by the capacitive sensor.

Isolating Capacitive Sensor with an Oxide Layer on the Metal Case

Instead of putting the capacitive sensor behind or inside a metal case, the capacitive sensor can be embedded with the metal case where at least a portion of the capacitive sensor is placed on the outside of metal case to overcome the Faraday shield effect. In between the capacitive sensor and the metal case is an insulator, such as an oxide layer which can be formed on the metal case through anodization, oxidation, chemical vapor deposition, laser activation, or other applicable process to isolate the capacitive sensor from the metal case. Other applicable processes can include such as applying, painting, or spraying an insulation layer (e.g., epoxy, enamel, etc.) that can adhere to a metal case, which can be particularly useful if some metal cases do not form an anodized outer layer easily. Besides providing the insulator, a hard outer coating can be provided over the (thin) capacitive sensor to protect the (fragile) sensor from abrasions or scratches. As a result, capacitive sensing can be implemented even when the mobile device's design requires a metal case.

As used herein, behind or inside of a metal case generally refers to an area or cavity where the electronics of the mobile device are located or housed. Outside of a metal case generally refers to an outside environment of the mobile device or handheld device facing a user during normal operation, especially the area where user interaction with the capacitive sensor is expected. Metal cases can include metal bodies, metal covers, metal trays, metal frames, and/or metal housings, which cover or encloses electronics of the mobile device.

Figure 2:
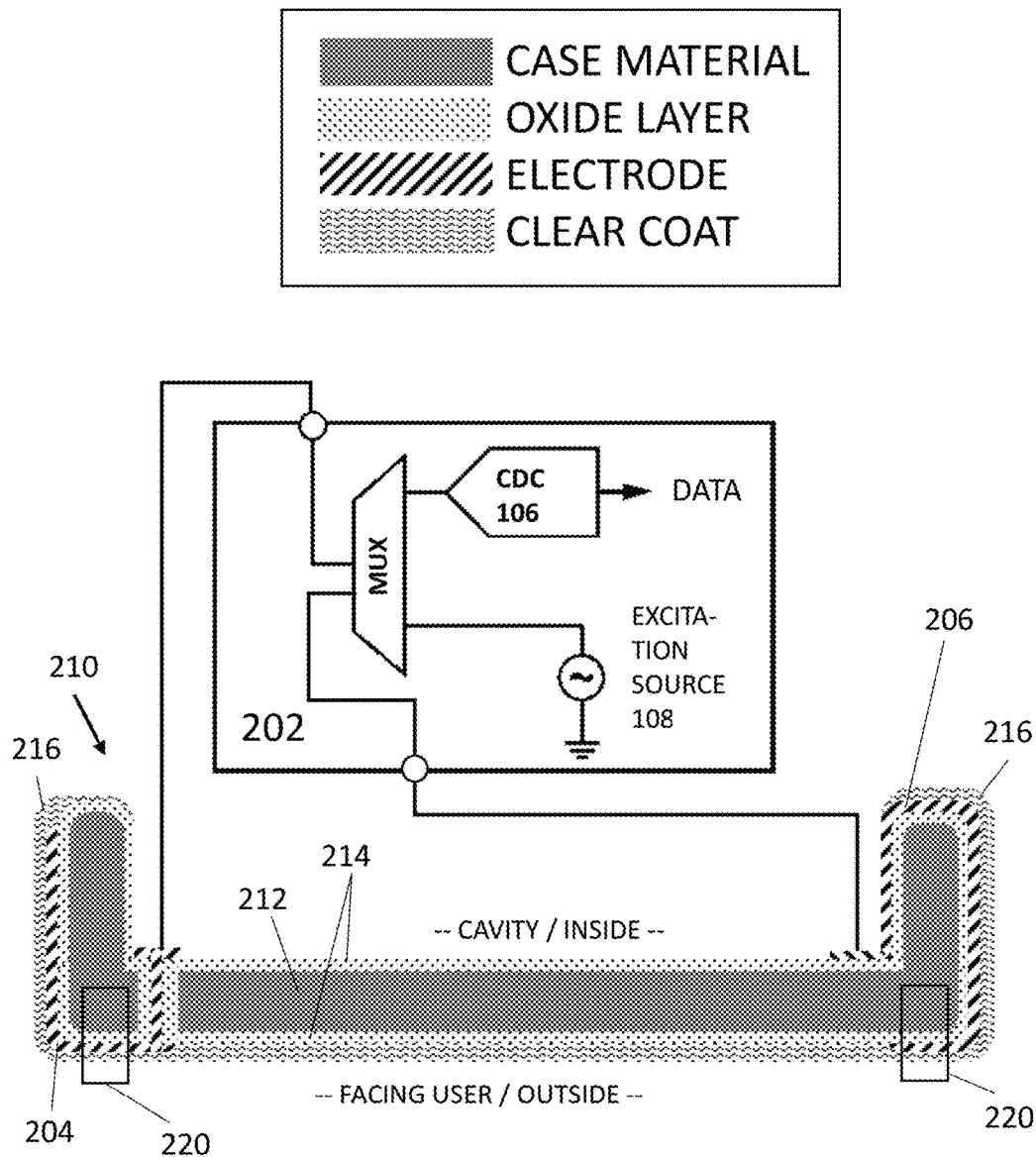
FIG. 2 shows a cross section of an exemplary metal case of an electronic device having two different designs of capacitive sensors embedded therewith, according to some embodiments of the disclosure.

FIG. 2 shows a cross section of an exemplary metal case of a handheld device having two different designs of capacitive sensors embedded therewith, according to some embodiments of the disclosure. The capacitive sensing controller 202 is similar to the capacitive sensing controller 104, but differs in that additional pins are provided to electrically connect to a plurality of capacitive sensors embedded in the metal case 210, e.g., capacitive sensor 204 having a first design, and capacitive sensor 206 having a second design. The capacitive sensing controller 202 is meant to be illustrative and non-limiting to the present disclosure, and other suitable implementations are envisioned by the disclosure. A key or legend is shown, which maps the patterns to possible suitable materials. The shape of the metal body portion 212 of the metal case 210 can vary depending on the application. The exemplary metal case 210 of an electronic device can have one or more capacitive sensors (e.g., capacitive sensor 204 and capacitive sensor 206) embedded with the metal case 210. The metal case 210 can include a metal body portion 212 forming the metal case 210, wherein at least part of the outer surface of the metal body portion 212 is anodized (shown as having an oxide layer 214). If anodization is not possible or preferred, the part of the outer surface of the metal body portion 212 can be oxidized, or an insulation layer can be provided thereon.

In some cases, the entire outer surface of the metal body portion 212 is anodized, while in some other cases, only a portion of the outer surface of the metal body portion 212 (where capacitive sensors are being embedded) is anodized. In some cases, the entire outer surface of the metal body portion 212 is anodized but part(s) of the oxide layer is subsequently polished off or removed so that part(s) of the outer surface of the metal body portion 212 is left anodized. The anodization forming an oxide layer 214 allows the oxide layer 214 to electrically insulate the metal body portion 212. The anodization can form a color (if dyed) and/or texture on the metal body portion 212. Other alternative insulators to the oxide layer 214 are envisioned by the disclosure.

The metal case 210 further includes an outer non-conductive layer 216 exposed to outside environment of the electronic device. The outer non-conductive layer 216 serves to protect a substantial portion of the embedded capacitive sensor from, e.g., damage caused by objects in the environment, since the capacitive sensor can be thin and fragile.

To embed a capacitive sensor, the metal case 210 further includes a first conductor 204 or 206 forming the capacitive sensor. The first conductor 204 or 206 includes (1) a first portion positioned between an anodized outer surface of the metal body portion 212 (e.g., oxide layer 214) and the outer non-conductive layer 216, and (2) a second portion electrically connectable to a capacitive sensing controller 202. The first portion is the sensing portion which is placed outside of the metal case 210 to overcome the Faraday shielding effect so that capacitive sensing functionalities are not impeded by the metal case 210 (or the metal body portion 212). The first conductor 204 or 206 is electrically insulated from the metal case 210 by the oxide layer 214, and furthermore, the first portion of the first conductor 204 or 206 is protected by the outer non-conductive layer. Generally speaking, the second portion is not encapsulated by the outer non-conductive layer. The second portion can form a soldering pad to provide an electrical connection with a capacitive sensing controller 202.

The different designs of the capacitive sensors illustrated in the FIGURE offer flexibility for how the capacitive sensing controller 202 on the inside of the metal case 210 can electrically connect to a capacitive sensor 204 or 206 that is substantially located on the outside of the metal case. In the first design, the capacitive sensor 204 goes through a hole in the metal body portion 212 of the metal case 210, and in the second design, the capacitive sensor 206 wraps around the metal body portion 212 of the metal case 210.

In the first design, "the borehole design", the first conductor 204 includes a third portion through a hole of the metal body portion 212 connecting the first portion and the second portion, wherein the surface of the metal body portion 212 inside the hole is anodized. The third portion allows the first conductor 204 to reach the inside of the metal case 210. Accordingly, the anodization inside the hole can provide electrical insulation between the metal body portion 212 and the first conductor 204 even inside the hole. Other conductors (if included) can also utilize this design if a wraparound design is not desirable. In some embodiments, the hole is used as a microphone opening, microphone/headphone jack, some card slot, some sensor opening, or some connector jack.

In the second design, the "wraparound design", the first conductor 206 wraps around the metal body portion 212 (along and over the oxide layer 214) to reach the inside of the metal case 210 rather than having a portion through a hole of the metal body portion 212. Other conductors (if included) can also utilize this design if the borehole design is not desirable. Both the first conductor 204 and the first conductor 206 include the second portion which can be used to connect the first conductor 204 and the first conductor 206 to capacitive sensing controller 202 or other suitable electronics for capacitive sensing.

FIG. 3 shows an exemplary zoomed-in view of a part of the cross section illustrated in FIG. 2, according to some embodiments of the disclosure. The zoomed-in view shows the region 220 marked in FIG. 2. In the embodiments shown, the metal body portion 212 ("case material"), the oxide layer 214, and the first conductor 204 or 206 ("electrode"), and the outer non-conductive layer 216 (e.g., "clear coat"), in this particular order, form the material stack. A first side of the first portion of the first conductor 204 or 206 is adjacent to the anodized outer surface (e.g., oxide layer 214) of the metal body portion 212. A second side of the first portion the first conductor 204 or 206 is adjacent to the outer non-conductive layer 216.

Exemplary Positioning or Placement of Capacitive Sensors

FIGS. 4A-C show different views of an exemplary metal case having six embedded capacitive sensors of a first design (borehole design) and associated electronics, according to some embodiments of the disclosure. FIGS. 5A-C show different views of an exemplary metal case having six embedded capacitive sensors of a second design (wrap around design) and associated electronics, according to some embodiments of the disclosure. It can be seen from the FIGURES that 6 capacitive sensors (or other suitable number of sensors) can be embedded with a metal case of an electronic device. Generally speaking, the capacitive sensors can be placed where user interaction (e.g., hand grips, dynamic hand interaction or movements) are expected for a given electronic device. For instance, the capacitive sensors can be placed opposite edges of the metal case. Wires or traces can be included to connect the capacitive sensors to a capacitive sensing controller 202 or other suitable electronics. Not all of the capacitive sensors must use the same design (some can use the borehole design, while others use the wraparound design). Other configurations, shapes, placements, and sizes of capacitive sensors are envisioned by the disclosure.

Double Layer Design for More Effective Capacitive Sensing

In many cases, the metal body portion of the metal case is grounded, and the electric field being generated by a conductor (e.g., the first conductor of FIG. 2) can be attenuated by the metal case quickly, thus reducing the "range" of capacitive sensing. To address this issue, it is possible to provide (1) a base electrode which is driven to some potential (sometimes referred herein as the "potential offset electrode"), (2) some dielectric layer, and (3) a sensing electrode over the base electrode for capacitive sensing. The potential of the base electrode can be the same or higher than the sensing electrode, and the base electrode can assist in projecting the electric field outwards so that the sensing electrode can have a greater sensing "range". The result is a double layer capacitive sensor that can be more sensitive to, e.g., hand movements which are farther away from the embedded capacitive sensor of the metal case.

Figure 6:
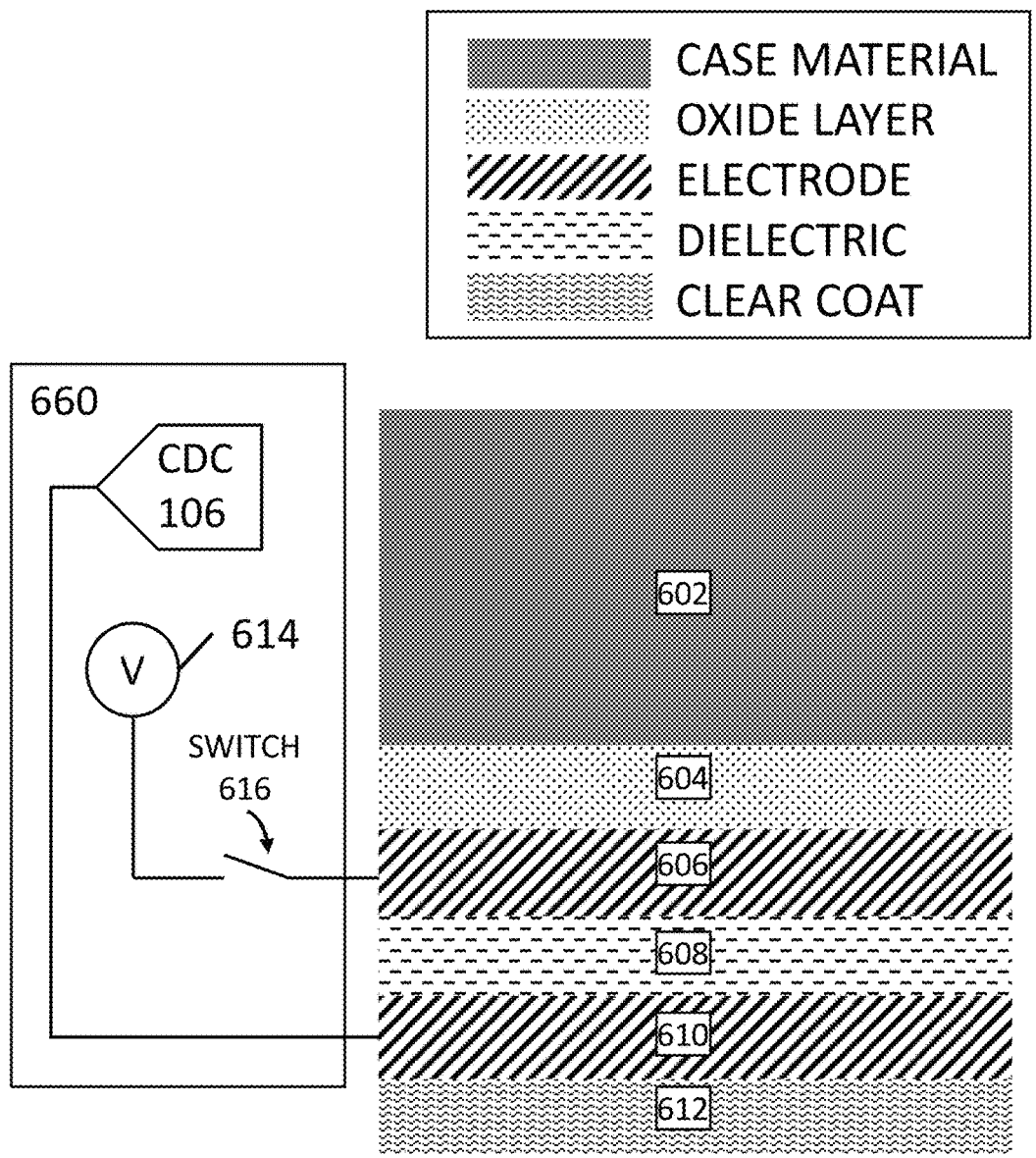
FIG. 6 shows an illustrative double layer capacitive sensor embedded with an exemplary metal case of an electronic device, according to some embodiments of the disclosure.

FIG. 6 shows an illustrative double layer capacitive sensor embedded with an exemplary metal case of an electronic device, according to some embodiments of the disclosure. Specifically, the FIGURE shows a zoomed-in cross section that illustrates a material stack of the exemplary metal case. Similar to FIG. 2, the metal case includes a metal body portion 602 forming the metal case, wherein at least part of the outer surface of the metal body portion 602 is anodized (shown as oxide layer 604). Alternatively, other suitable insulating layer besides the oxide layer 604 can be formed on the outer surface of the metal body portion 602. The metal case includes an outer non-conductive layer 612 exposed to outside environment of the electronic device and protects the capacitive sensor. Furthermore, the metal case includes a first conductor 610 forming the capacitive sensor. In this embodiment, the first conductor 610 forms the sensing electrode. The first conductor 610 comprises: (1) a first portion positioned between an anodized outer surface of the metal body portion (e.g., oxide layer 604) and the outer non-conductive layer 612, and (2) a second portion electrically connectable to a capacitive sensing controller 660. To provide the base electrode, the metal case further includes a second conductor 606 forming a potential offset electrode positioned between the anodized outer surface of the body portion (e.g., oxide layer 604) and the first portion of the first conductor 610, and a dielectric layer 608 positioned between the first conductor 610 and the second conductor 606.

For instance, the second conductor 606 can include: (1) a first portion positioned between the (anodized) outer surface of the body portion (e.g., oxide layer 604) and the first portion of the first conductor 610, and (2) a second portion electrically connectable to a capacitive sensing controller 660. Specifically, the first portion of the second conductor 606 is separated from the first portion of the first conductor 610 by the dielectric layer 608.

The material stack accordingly has the following order: metal body portion 602 ("case material"), oxide layer 604, second conductor 606 ("electrode"), dielectric layer 608 ("dielectric"), and first conductor 610 ("electrode"), and outer non-conductive layer 612 ("clear coat").

To form the base electrode, the second conductor 606 is connectable and dis-connectable from a predetermined voltage potential 614 via a switch 616, e.g., in the capacitive sensing controller 660. The second conductor 606 can serve as a balloon of charge. By charging the second conductor 606 to the predetermined voltage potential 614 (e.g., by closing switch 616) to achieve a nominal potential relative to the metal body portion 602 and subsequently isolating the second conductor 606 by the switch 616 (e.g., by opening switch 616), it is possible to drive the electric field of the capacitive sensor farther outwards to increase the "range" of the capacitive sensor. For instance, if the metal body portion 602 is grounded and the sensing electrode is to operate at a predetermined voltage potential V, the capacitive sensing controller 660 can float the first conductor 610 (sensing electrode), charge the base electrode to the predetermined voltage potential V, and disconnect the second conductor 606 (base electrode) using switch 616. Charge is then trapped on the base electrode to assist the "range" of the sensing electrode.

FIG. 7 shows a view of an exemplary metal case having an embedded double layer capacitive sensor and associated electronics, according to some embodiments of the disclosure. Specifically, FIG. 7 shows a front view of a double layer capacitive sensor that is embedded in a metal case 700. Same as FIG. 6, an oxide (or insulating) layer 704 is provided or formed on at least part of the outer surface of the metal body portion 702 of the metal case 700 to electrically insulate the metal body portion 702 from the capacitive sensor (i.e., one or more conductive layers). The metal case 700 further includes the second conductor 706 forming the base electrode. The second conductor 706 can be sprayed onto the region insulated by the oxide layer 704. The metal case 700 further includes the first conductor 710 forming the sensing electrode. The metal case 700 further includes a dielectric layer 708, which is deposited over (and enclosing) the second conductor 706 to electrically isolate the second conductor 706 from the first conductor 710. The second conductor 706 can span a larger area than the first conductor 710. An outer non-conductive layer 712 such as a clear coat can be provided to cover the double layer capacitive sensor to protect from surface abrasions. The result is a double layer capacitive sensor embedded with the metal case 700 with an improved sensing "range".

A borehole design or a wraparound design (or any suitable design for connecting the conductors to a capacitive sensing controller inside the metal case) can be used for the first conductor 710 and the second conductor 706, depending on the implementation. The example shown in FIG. 7 is a wraparound design where a portion of the conductor (e.g., a trace) wraps around the edge of the metal case to electrically connect the conductor to the capacitive sensing controller. In some cases, the same portion can go through one or more holes (anodized such that the surface inside the hole is insulated by an oxide layer) in the metal body portion 702 to electrically connect the conductor to the capacitive sensing controller.

Capacitive Sensor Embeddable with a Metal Case

Broadly speaking, the capacitive sensor embedded on a metal case of an electronic device illustrated herein includes a first conductive pad placed between an electrically-insulating outer layer of the metal case and an outer protective layer of the electronic device. The first conductive pad (forming the capacitive sensor) would include a first portion having the outer protective layer deposited thereon; and a second portion electrically connectable to a capacitive sensing controller of the electronic device. The electrically-insulating layer can include an oxide layer.

For the double layer capacitive sensor, the capacitive sensor would further include (1) a second conductive pad positioned between the electrically-insulating outer layer of the metal case and the first portion of the first conductive pad, and (2) a dielectric layer positioned between the first conductor and the second conductor. The first conductive pad forms the sensing electrode (or floating sensing electrode); the second conductive pad forms the base electrode (or forms a potential offset electrode for projecting an electric field outwards when charge is stored on the potential offset electrode). The second conductive pad is connectable and dis-connectable from a predetermined voltage potential via a switch (e.g., an isolating switch). The second conductive pad would generally span a larger area than the first conductive pad.

Figure 8:
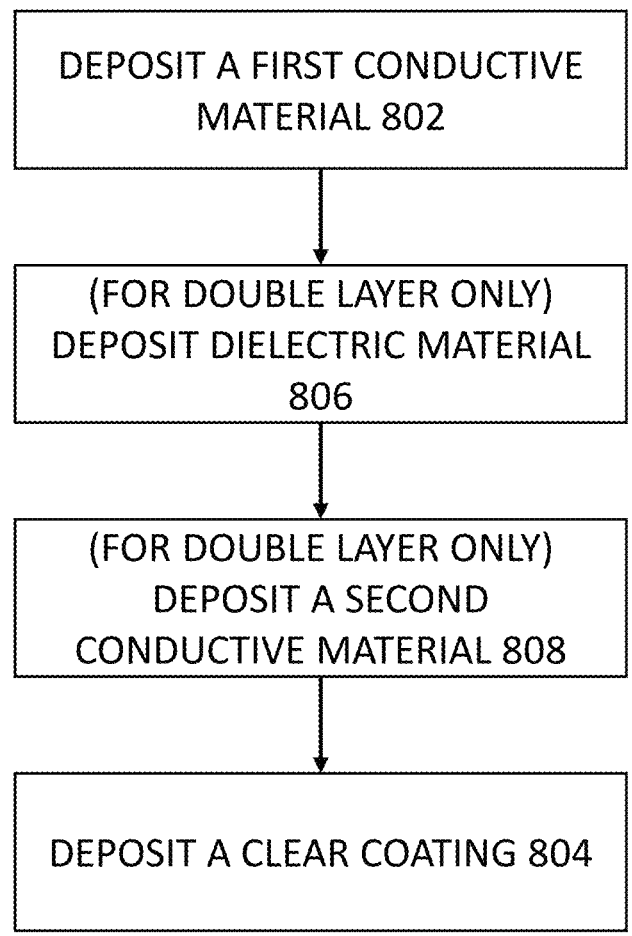
FIG. 8 is a flow diagram illustrating a method for fabricating a capacitive sensor onto a metal case of an electronic device, according to some embodiments of the disclosure.

Method for Fabricating a Capacitive Sensor onto a Metal Case of an Electronic Device FIG. 8 is a flow diagram illustrating a method for fabricating a capacitive sensor onto a metal case of an electronic device, according to some embodiments of the disclosure. The method includes depositing a first conductive material onto an anodized outer surface of the metal case (task 802). In some alternative embodiments, the method includes depositing an electrically insulating layer on the outer surface (instead of forming an anodized outer surface), and the first conductive material is deposited on the insulating layer. The first conductive material forms a first pad section and a first trace section connectable to electronics of the electronic device (e.g., a capacitive sensing controller). The conductive material can be sprayed, painted, placed, deposited, formed, or provided in any suitable manner onto the anodized outer surface. The method further includes depositing a clear coating as an outer finish of metal case to protect material between the metal case and the clear protective coating (task 804).

To fabricate a double layer capacitive sensor, the method further includes depositing a dielectric material on the first pad section of the first conductive material (task 806). The dielectric material can enclose the first pad section of the first conductive material. Furthermore, the method includes depositing a second conductive material onto the dielectric layer (and possibly the second conductive material may be deposited onto a portion of the anodized outer surface of the metal case to form a trace) (task 808). The second conductive material forms a second pad section for capacitive sensing and a second trace section connectable to electronics of the electronic device. The first conductive material in this method forms the base electrode, and the second conductive material forms the sensing electrode.

Materials Considerations

The metal case can be made of aluminum or other suitable metals where anodization and/or growing of an (uniform) oxide layer (e.g., oxide layer 214) or other electrically-insulating layer is possible. The metal case would form the housing for electronics of the mobile device as well as the shell or exterior that provides the metal look and feel for the user. The metal case may have different shapes, sizes, and/or thicknesses, depending on the application. For instance, material forming the metal body portion comprises one or more of the following: aluminum, titanium, zinc, and magnesium. Choice of materials may depend on factors such as cost, weight, and the ability to anodize and form an oxide layer. In some embodiments, an electrically-insulating layer is added to the metal case instead of anodization. In some embodiments, anodized outer surface (e.g., oxide layer 214) comprises an oxide layer that is 5-200, or 25 to 200 micrometer thick.

The first conductor (or any conductor mentioned herein, such as the second conductor of the double layer capacitive sensor) is typically made of any suitable conductive material which can be used as the capacitive sensor. In some embodiments, the material forming following: conductive polymers, organic semiconductors, carbon, copper, silver, and gold. In some embodiments, the material forming the first conductor comprises one or more of the following: indium tin oxide, transparent conducting oxide, carbon nanobuds, and carbon nanotubes. These materials are preferable since the conductor can be made substantially transparent or translucent to preserve the metal look of the metal case.

The outer non-conductive layer 212 can be a hard coating, a clear coat (as the example shown in the FIGURE), a clear protective coating, or any suitable protective non-conductive material that can offer protection against scuffs or abrasions, since the conductor can be thin and fragile. For instance, the outer non-conductive layer (or an outer protective layer) can include a clear coat or a transparent epoxy. The outer non-conductive layer 212 is preferably clear, transparent, or translucent so that the metal look is not covered or ruined by the outer non-conductive layer. However, in some cases, the outer non-conductive layer 212 can be opaque, semi-opaque, or forms a visual design or decal which visually obscures the conductor embedded in the metal case.

Capacitive Sensing System

Figure 9:
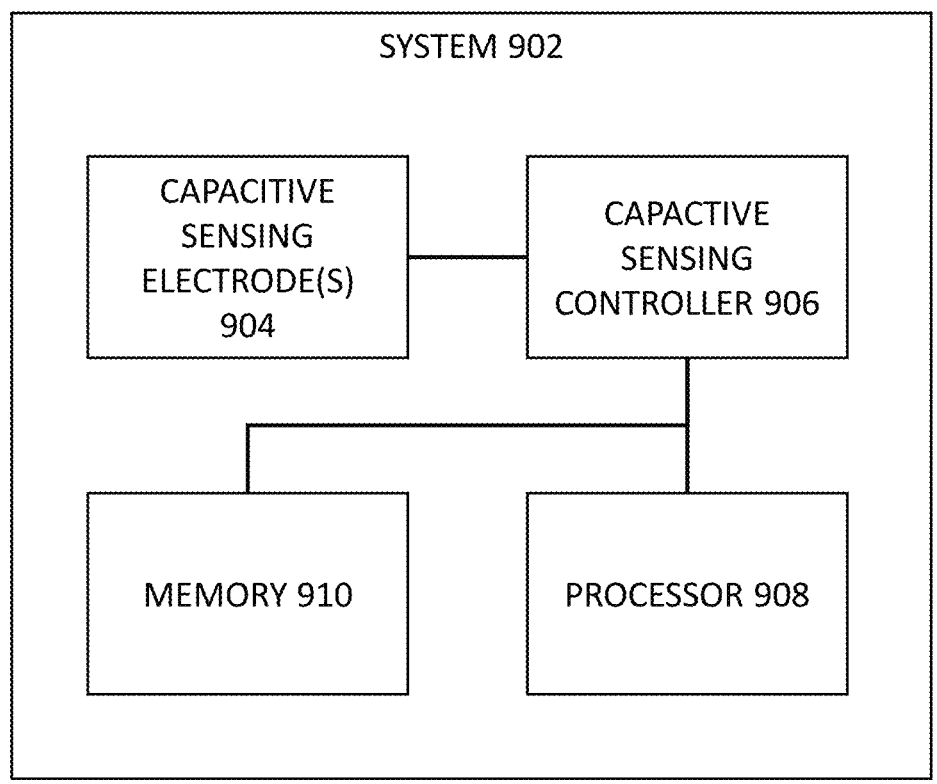
FIG. 9 illustrates an exemplary capacitive sensing system, according to some embodiments of the disclosure.

FIG. 9 illustrates an exemplary capacitive sensing system for gesture recognition, according to some embodiments of the disclosure. The capacitive sensing system 902 comprises one or more capacitive sensing electrodes 904, a capacitive sensing controller 906, one or more non-transitory computer-readable memory 910, and one or more processors 908. The capacitive sensing electrodes 904 are electrically coupled (e.g., via signal traces) to a capacitive sensing controller 906 (similar to controller 104 and controller 202 of the FIGURES), which is configured output capacitive sensing measurements. The capacitive sensing measurements can be stored in memory 910. In some instances, the processor 908 may be configured to carrying out the method for gesture recognition described herein by executing one or more instructions stored on a non-transitory computer medium such as memory 910. In alternative embodiments, the processor 908 can be a dedicated processor having circuitry specifically designed for gesture recognition. In some embodiments, the processor 908 can include both processing circuitry which can execute instructions stored in memory 910, and circuitry specifically designed for gesture recognition. The specialized circuitry, can include circuitry which can implement any one or more of the classifiers, for example, or the processes within the one or more classifiers (e.g., computing ratios, derivatives, etc.) In some embodiments, the processor 908 may include one or more application specific components, or may include programmable logic gates which are configured to carry out the functions describe herein. The circuitry can operate in analog domain, digital domain, or in a mixed signal domain.

Variations and Implementations

The terms "capacitive sensor" and "capacitive sensing electrode" are used interchangeably. The terms "conductor" and "electrode" can be used interchangeably. The terms "conductor", "conductive layer", "conductive pad", and "conductive material" can be used interchangeably. The terms "outer non-conductive layer" and "outer protective layer" can be used interchangeably. The terms "dielectric layer" and "dielectric material" can be used interchangeably.

Note that the activities discussed above with reference to the FIGURES are applicable to any integrated circuits that involve gesture recognition using capacitive sensing. The improved capacitive sensing approach and method can be applicable to any electrical device where a gesture recognition user interface is desirable. These electrical devices can be found in many different contexts, for instance, consumer electronics (mobile devices, appliances, gaming systems, computers, augmented reality, virtual reality), medical systems, scientific instrumentation, industrial systems, aerospace systems, automotive systems, security systems, etc.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the gesture recognition functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to gesture recognition, illustrate only some of the possible functions that may be executed by, or within, systems illustrated in the FIGURES, such as FIG. 9. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for fabricating a capacitive sensor onto a metal case of an electronic device including a battery:
   directly depositing a first conductive material onto an anodized outer surface of the metal case, wherein a first conductive material forms a first pad section and a first trace section connectable to electronics of the electronic device; and
   depositing a clear coating as an outer finish of metal case to protect the first conductive material between the metal case and the clear protective coating;
   connecting the metal case to the ground of the battery;
   directly depositing a second conductive material onto the anodized outer surface of the metal case, wherein the second conductive material forms a second pad section for capacitive sensing and a second trace section connectable to electronics of the electronic device;
   wherein, the clear coating covers the first conductive material disposed on the anodized outer surface of the metal case, the second conductive material disposed on the anodized outer surface of the metal case, and a substantial majority of the metal case.

2. A case for an electronic device having a plurality of capacitive sensors embedded thereto case comprising:
   a case body;
   an interior which defines a cavity;
   a circuit disposed within the interior cavity;
   an exterior comprising an oxide layer which is deposited directly onto and covers at least part of the case body;
   a plurality of capacitive sensors disposed directly on the oxide layer; and
   a plurality of electrical conductors which are in electrical communication with the plurality of capacitive sensors and the circuit disposed within interior cavity;
   wherein, the exterior further comprises a dielectric layer deposited onto the plurality of capacitive sensors and substantially covers a majority of the case body.

3. The case of claim 2, wherein the case body comprises a metal and grounded to a battery of the electronic device.

4. The case of claim 3, wherein the oxide layer substantially comprises a metal oxide formed from the metal, at least in part.

5. The case of claim 2 further comprising a controller configured to perform capacitive sensing for the electronic device, the controller in electrical communication with the circuit disposed within the cavity's interior.

6. The case of claim 2, wherein at least one of the plurality of capacitive sensors achieves electrical communication with the circuit disposed within the cavity's interior through an aperture in the case body.

7. The case of claim 6, wherein the aperture comprises anodized walls.

8. The case of claim 2, wherein at least a portion of the electrical communication of at least one of the plurality of capacitive sensors with the controller is not covered by the dielectric layer.

9. The case of claim 2, wherein at least one of the plurality of capacitive sensors achieves electrical communication with the circuit disposed within the cavity's interior through a hole in the case body.

10. The case of claim 2, wherein a least one of the plurality of capacitive sensors is connectable and dis-connectable from a predetermined voltage potential via a switch.

11. The case of claim 3, wherein the metal is one or more of the following: aluminum, titanium, zinc, and magnesium.

12. The case of claim 2, wherein the plurality of capacitive sensors are conductive pads comprising one or more of the following: conductive polymers, carbon, copper, silver, and gold.

13. The case of claim 2, wherein the plurality of capacitive sensors are conductive strips comprising one or more of the following: conductive polymers, carbon, copper, silver, and gold.

14. The case of claim 2, wherein the plurality of capacitive sensors comprises one or more of the following: indium tin oxide, transparent conducting oxide, carbon nanobuds, and carbon nanotubes.

15. A case for an electronic device having a plurality of capacitive sensors embedded thereto case comprising:
   means for forming a metal case body;
   means for forming an anodized layer by oxidizing an exterior of the metal case body;
   means for depositing a first conductor directly onto the anodized layer, the conductor configured to sense capacitance proximal to the case; and,
   means for depositing a dielectric layer directly onto the first conductor;
   wherein, the dielectric layer substantially convers the exterior of the metal body case.

16. The case of claim 15, wherein the first conductor includes a first capacitive pad and first conductive trace which is in electrical communication with the electronic device.

17. The case of claim 16, the capacitive sensor further comprising:
   means for depositing a second conductor directly onto the anodized layer, the second conductor configured to sense capacitance proximal to the case;
   wherein the second conductor includes a second capacitive pad and second conductive trace which is in electrical communication with the electronic device.

18. The case of claim 17, wherein the first conductive pad forms a floating sensing electrode; and
   the second conductive pad forms a potential offset electrode for projecting an electric field outwards when charge is stored on the potential offset electrode.

* * * * *